United States Patent
Hornbeck

(12) 
(10) Patent No.: US 6,447,126 B1
(45) Date of Patent: *Sep. 10, 2002

(54) SUPPORT POST ARCHITECTURE FOR MICROMECHANICAL DEVICES

(75) Inventor: Larry J. Hornbeck, Van Alstyne, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/482,098

(22) Filed: Jun. 7, 1995

Related U.S. Application Data

(62) Division of application No. 08/333,186, filed on Nov. 2, 1994, now Pat. No. 5,650,881.

(51) Int. Cl.⁷ ............................................. G02B 7/182
(52) U.S. Cl. ....................... 359/871; 359/872; 359/883; 359/884
(58) Field of Search ............................... 359/871, 872, 359/883, 884, 224, 295, 291

(56) References Cited

U.S. PATENT DOCUMENTS

| | | | |
|---|---|---|---|
| 4,441,791 A | 4/1984 | Hornbeck | 359/295 |
| 4,710,732 A | 12/1987 | Hornbeck | 332/7.51 |
| 4,954,789 A | 9/1990 | Sampsell | 330/4.3 |
| 5,011,580 A | 4/1991 | Pan et al. | 204/15 |
| 5,061,049 A | 10/1991 | Hornbeck | 359/224 |
| 5,083,857 A | 1/1992 | Hornbeck | 359/291 |
| 5,202,785 A | 4/1993 | Nelson | 359/214 |
| 5,216,537 A | * 6/1993 | Hornbeck | 359/291 |
| 5,233,456 A | * 8/1993 | Nelson | 359/214 |
| 5,348,619 A | * 9/1994 | Bohannon et al. | 156/664 |
| 5,444,566 A | * 8/1995 | Gale et al. | 359/224 |
| 5,469,302 A | * 11/1995 | Lim | 359/224 |
| 5,485,304 A | * 1/1996 | Kaeriyama | 359/224 |

FOREIGN PATENT DOCUMENTS

EP  0 469 293 A1  2/1992

* cited by examiner

*Primary Examiner*—Mohammad Sikder
(74) *Attorney, Agent, or Firm*—Charles A. Brill; Wade James Brady III; Frederick J. Telecky, Jr.

(57) ABSTRACT

A support pillar 426 for use with a micromechanical device, particularly a digital micromirror device, comprising a pillar material 422 supported by a substrate 400 and covered with a metal layer 406. The support pillar 426 is fabricated by depositing a layer of pillar material on a substrate 400, patterning the pillar layer to define a support pillar 426, and depositing a metal layer 406 over the support pillar 426 enclosing the support pillar. A planar surface even with the top of the pillar may be created by applying a spacer layer 432 over the pillars 426. After applying the spacer layer 432, holes 434 are patterned into the spacer layer to remove any spacer material that is covering the pillars. The spacer layer is then reflowed to fill the holes and lower the surface of the spacer layer such that the surface is coplanar with the tops of the support pillars 426.

17 Claims, 8 Drawing Sheets

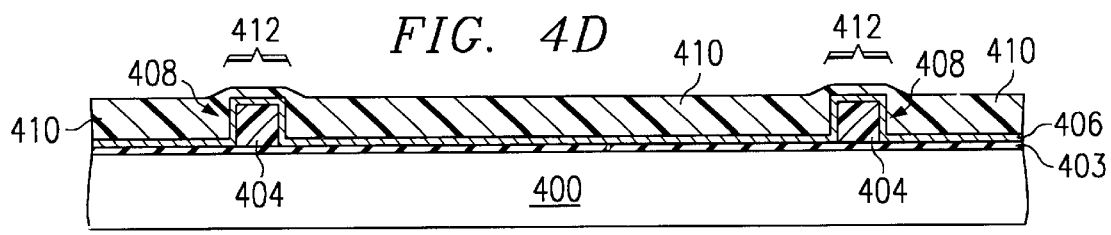
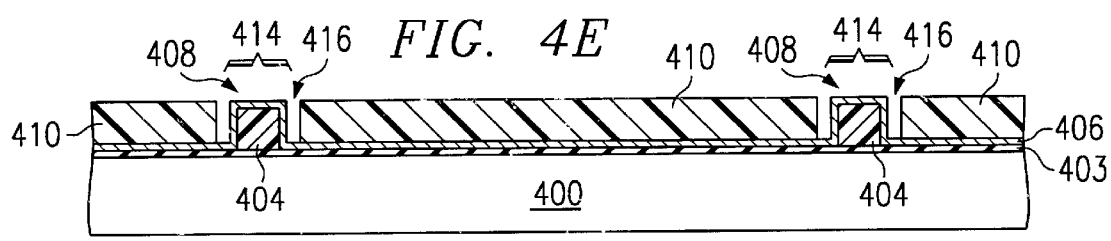
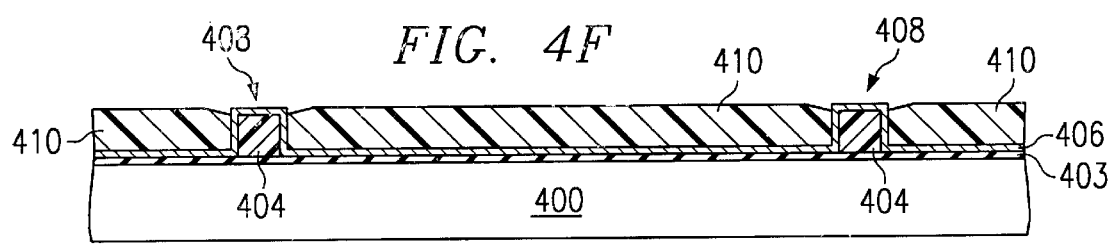
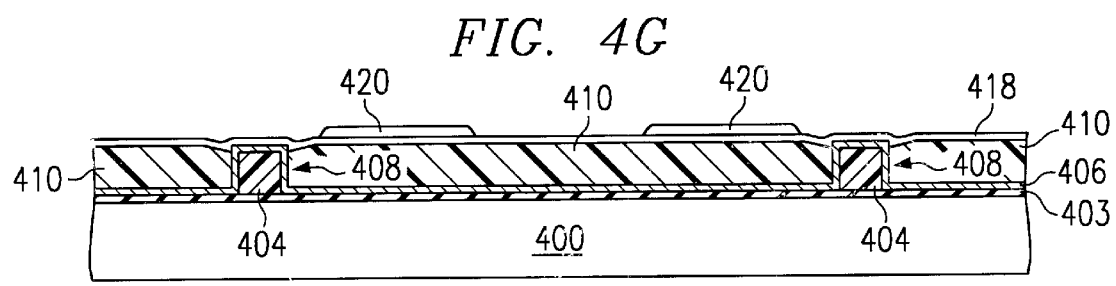
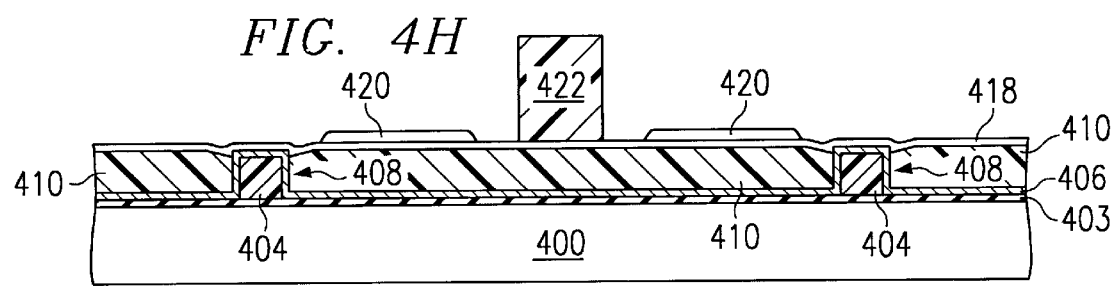

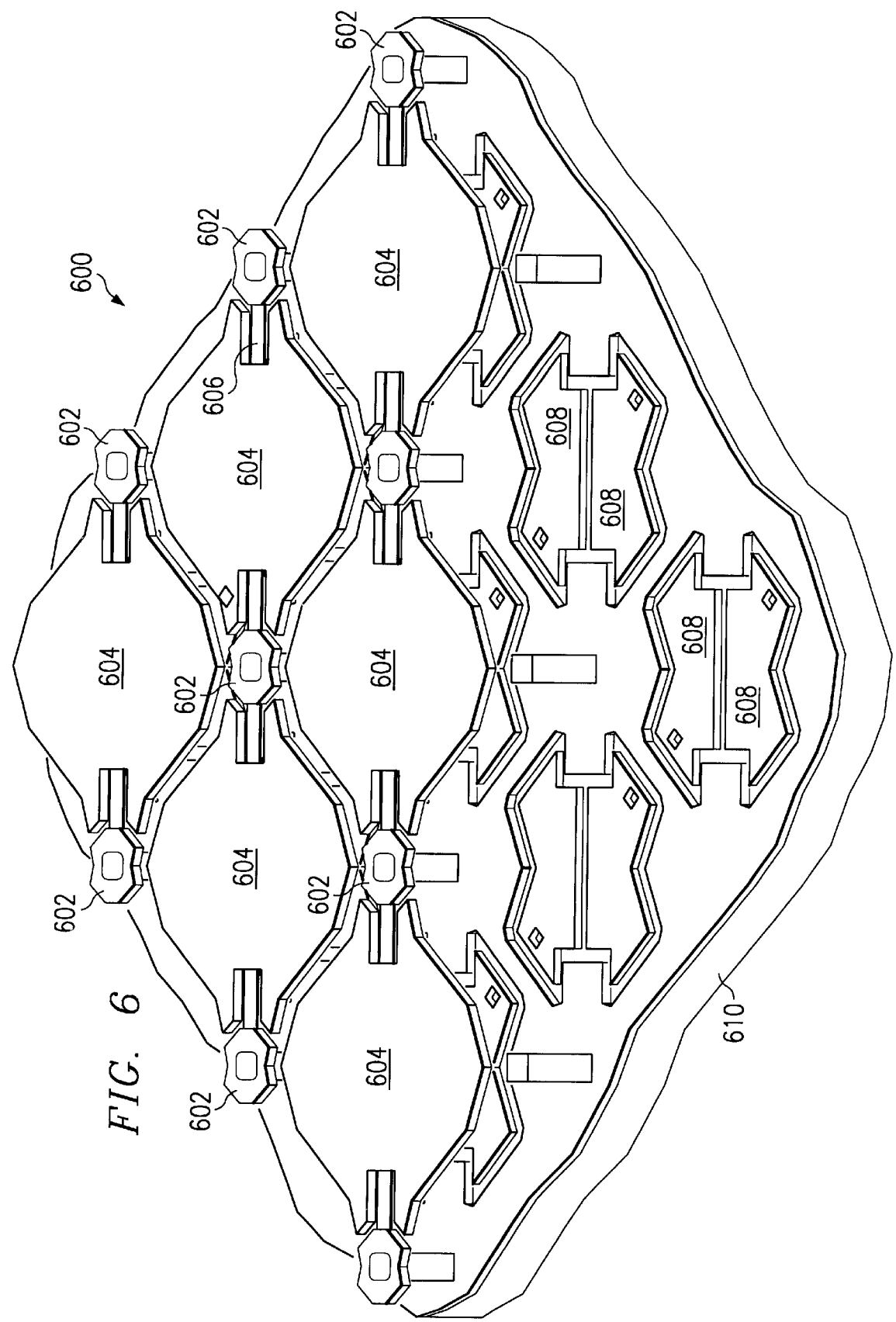

SUPPORT POST ARCHITECTURE FOR MICROMECHANICAL DEVICES

This is a division application Ser. No. 08/333,186, filed Nov. 02, 1994 U.S. Pat. No. 5,650,881.

TECHNICAL FIELD OF THE INVENTION

This invention relates to micromechanical devices and more particularly to support structures integral to such devices.

BACKGROUND OF THE INVENTION

One type of light deflecting spatial light modulator (SLM) is the digital micromirror device (DMD). DMDs are available in several different forms including tlexure beam, cantilever beam, and both conventional and hidden hinge torsion beam designs. Each type of DMD includes an array of small mirrors which move out of a resting position, e.g. rotate or deflect, in response to an electrostatic field produced by an electrical signal, typically called an address signal. The resting position of the mirror is typically parallel to the surface of the device. Light is reflected from the surface of the mirror and as the mirror is moved, the direction of the reflected light is changed. The resting position of the mirror is determined by a beam or spring, often called a hinge which supports the mirror and which stores energy during mirror movement. This stored energy tends to return the mirror to the resting position when the address voltage is removed or reduced.

Deformable micromirror devices are also referred to as DMDs. The difference between digital micromirror devices and deformable micromirror devices is that-digital micromirror devices are operated in a bistable mode, as taught in U.S. Pat. No. 5,061,049, issued Oct. 29, 1991, and entitled "Spatial light Modulator and Method". Digital operation of the micromirror devices includes the application of a bias voltage that ensures that the mirrors have a maximum rotation in either the "on" or "off" direction regardless of the magnitude to the address voltage. The mirror deflection of deformable micromirror devices is an analog function of the voltage applied to the device. The structure of digital micromirror devices and deformable micromirror devices is very similar. The disclosed invention may be used in conjunction with either digital, or deformable micromirror devices.

DMDs are typically used in a dark field projection arrangement and can be used, for example, in HDTV applications where a large array of pixels is necessary for the desired image resolution. In addition to the high resolution capabilities of the DMD, another feature that is very useful in video display applications is the speed at which the mirror can be controlled, or the response time of the device. The short response time allows the present generation of DMDs to be toggled on and off up to 180 thousand times each second. Each deflection cycle stores energy in the DMD beam or spring and mechanically stresses the device structure.

DMDs are part of a larger group of devices known as micromechanical devices. Micromechanical devices include some accelerometers, flow sensors, electrical motors, and flow control devices. These devices are often fabricated by processes known as micromachining. Micromachining involves the removal of unwanted material from either the substrate on which the device is being fabricated, or from one or more layers of material that is deposited during the fabrication of the device. The material is typically removed to allow some part of the completed device to move. For example, material must be removed from a motor to allow a rotor to spin around a stationary shaft. In the case of a DMD, material must be removed from below the DMD mirror to allow the mirror to deflect or rotate.

Sometimes an entire layer, called a sacrificial layer, is used during the fabrication process. For example, DMDs are typically fabricated by depositing a sacrificial layer over the circuitry required to deflect the mirror. Mirrors and their hinges are then built on this spacer layer by depositing and patterning one or more metal layers. The metal layers are typically aluminum or an aluminum alloy and are patterned to define a mirror connected to at least one hinge cap by a hinge. In early forms of DMDs, the sacrificial layer was removed from beneath the mirrors and hinges, leaving a portion of the sacrificial layer to support the hinge caps. The mirrors were suspended by the hinges above the wells formed by removing the sacrificial material.

Recent DMD designs include a hole or via in the sacrificial layer at the location of each hinge cap prior to depositing the hinge metal. When the hinge dial is deposited on the sacrificial layer, it is also deposited on the walls of the via, creating a topless hollow post structure known as a spacervia. After the mirrors, hinges and hinge caps are patterned, all of the sacrificial layer is removed leaving only the spacervia to support the hinge caps away from the device substrate. Other types of DMDs, such as the so called "Hidden Hinge" torsion beam device as taught by U.S. Pat. No. 5,083,857, issued Jan. 28, 1992 and entitled "Multi-Level Deformable Mirror Device", use two or more sacrificial layers. The hidden hinge torsion beam DMD uses one set of spacervias to support the hinges above the device substrate and a second set of spacervias to support the mirror above the hinges.

The electrostatic forces used to deflect the mirrors generate mechanical stresses in the supporting hinge and spacervia structures. These stresses can lead to a failure in the supporting structure, ruining the device. There is a need in the art for an improved support structure for DMDs and other micromechanical devices.

SUMMARY OF THE INVENTION

The present invention provides a structure and process for an improved support post structure, called a support pillar. The support pillar may he used in a micromechanical device, particularly a digital micromirror device (DMD). The support pillar is fabricated by depositing a layer of pillar material on a substrate, patterning the pillar material to define the shape of the support pillar, and depositing a metal layer over the remaining pillar material thereby enclosing the pillar material in a metal sheath. A planar surface, even with the top of the pillar, may he created by applying a spacer layer around the pillars. After applying the spacer layer, holes are patterned into the spacer layer to remove any pillar material that is covering the pillars. The spacer layer is then reflowed to fill the holes and lower the surface of the spacer layer such that the surface is coplanar with the tops of the support pillars.

The support pillar may be used as a support post in any type of digital micromirror device including the conventional torsion beam DMD and the hidden hinge DMD. Hidden hinge DMDs may be fabricated using the support pillar to support either the hinges, the address electrodes, or the mirror, or any combination thereof.

The disclosed support structure and method of fabricating the same have several advantages over existing designs including improved support structure strength, a less chemically reactive spacer surface on which to continue device fabrication, and better spacer surface planarization.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 is a perspective view of a portion of a typical torsion beam DMD having improved support posts according to one embodiment of this invention.

DETAILED DESCRIPTION

A new fabrication process is needed to yield sufficiently strong and reliable support structures which may he used in DMDs and other types of micromechanical devices. To avoid confusion between existing support structures and the improved structure taught herein, support structures of the prior art will he referred to as spacervias, while the improved structures taught herein will he referred to as support pillars. Although the specific embodiments shown in this disclosure will show only DMD structures, the methods and structures taught are applicable to many other micromechanical devices.

Figure 1:
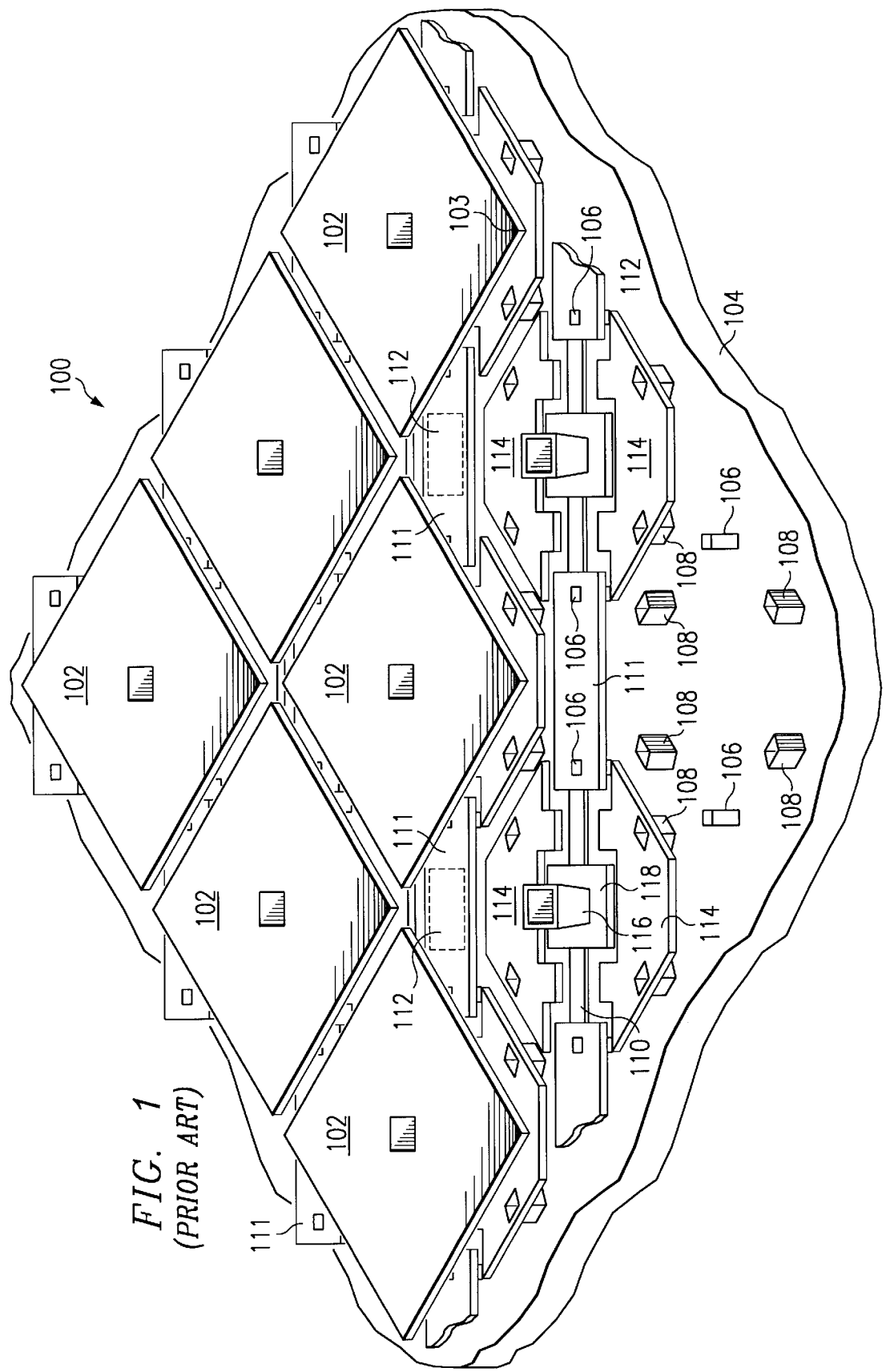
FIG. 1 is a perspective view of a portion of a typical hidden hinge torsion beam DMD array of the prior art.

FIG. 1 shows a perspective view of a portion of a hidden hinge torsion beam DMD array 100 of the prior art. Hidden hinge devices rely on two levels of spacervias to hold a mirror 102 away from a substrate 104. The first spacervia level includes a hinge support spacervia 106, and an address electrode support spacervia 108. The hinge support spacervia supports each end of a torsion hinge 110, away from the device substrate 104. The torsion hinge 110 attaches to the top of the hinge support spacervia 106 via a thick metal hinge cap 111. The metal hinge cap 111 strengthens the connection between the thin metal torsion hinge 110 and the hinge support spacervia 106 by ensuring adequate metal to metal contact between the hinge metal and the spacervia metal. On each hinge cap 111, is a landing site 112 which stops the rotation of either of two adjacent mirrors 102 when the mirrors are rotated towards the landing site 112. The address support spacervia 108 is used to hold an address electrode 114 away from substrate 104. The address support spacervias 108 and the hinge support spacervias 106 are typically the same height.

The second spacervia level includes a mirror support spacervia 116 which holds the mirror 102 above the torsion hinges 110. The mirror support spacervia 116 is fabricated on a thickened portion of the torsion hinge 110 called a hinge yoke 118. Like the hinge cap 111, the hinge yoke 118 strengthens the connection between the thin metal torsion hinge 110 and the mirror support spacervia 116 by ensuring adequate metal to metal contact between the torsion hinge 110 and the mirror support spacervia 116. The height of the mirror support spacervia 116 may be varied to control the maximum angular rotation of the mirror 102.

Figure 2:
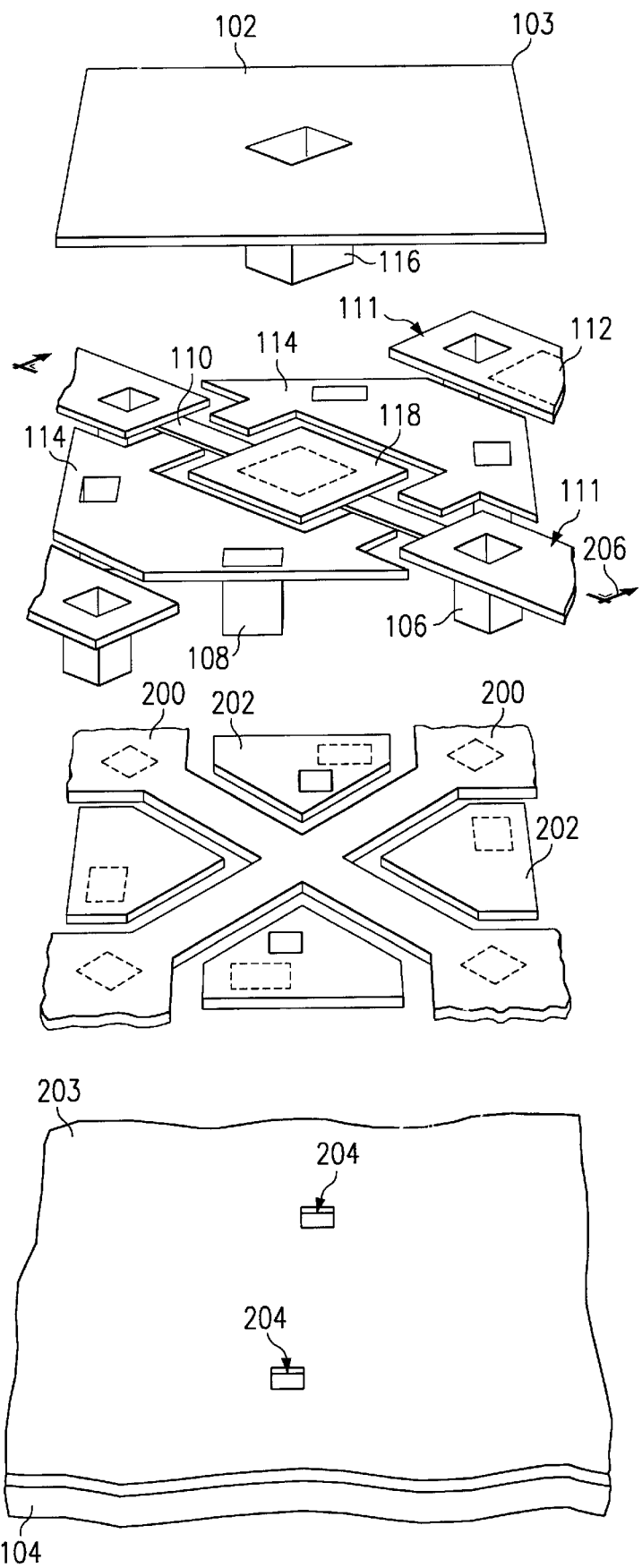
FIG. 2 is an exploded perspective view of a hidden hinge torsion beam DMD element of the prior art.

FIG. 2 is an exploded view of a single hidden hinge torsion beam DMD element. In addition to the structures discussed in regard to FIG. 1, FIG. 2 shows a metal bias/reset bus 200 and metal pads 202 which are deposited on the surface of the substrate 104. The metal bias/reset bus 200 supports the hinge support spacervias 106 and the metal pads 202 support the address electrode support spacervias 108. The metal pads 202 are connected, through vias 204 in a protective oxide layer 203, to the addressing circuitry built into the surface of the substrate 104. The metal pads electrically connect the address electrode support spacervias 108 to the addressing circuitry. The bias/reset bus 200 and the metal pads 202 are typically fabricated as part of the third device metalization layer or M3. The first two metal layers, M1 and M2, are used to interconnect the address circuitry on the substrate.

Referring back to FIG. 1, each mirror 102 and its address electrodes 114 form the two plates of an air gap capacitor. If a sufficient voltage bias is applied between the address electrode 114 and its associated mirror 102, the resulting electrostatic force will cause the mirror 102 to deflect towards the address electrode 114 thereby twisting the torsion hinge 110. If the applied voltage is sufficiently large, the mirror 102 will deflect until the mirror tip 103 touches the associated landing site 112 on the hinge cap 111, stopping the mirror rotation. If the hinge cap 111 did not contact the mirror tip 103 and stop the rotation of the mirror 102, the mirror 102 would touch the address electrode 114 and short circuit the bias voltage. Because there is one address electrode 114 on each side of the hinge axis in each element. the mirror 102 may be rotated in either direction, allowing the mirror 102 to assume one of two fully deflected states.

When the bias voltage is removed from the mirror 102 and address electrodes 114, the energy stored by the deformation of the torsion hinge 110 will tend to return the mirror 102 to the undeflected or neutral state. However, short-range attractive forces between the mirror 102 and the landing site 112 often cause the mirror 102 to stick to the landing site 112. When this occurs, a technique known as resonant reset may be used to free the stuck mirrors 102. The resonant reset technique uses a voltage pulse, or series of pulses, to store mechanical energy in the mirror 102. Typically resonant reset is a series of five −24 volt pulses applied to the mirror 102 at the resonant frequency of the mirror 102, approximately 5 MHz. Each pulse creates a very strong attraction between the mirror 102 and the address electrode 114. Because the mirror tip 103 is held in place by the landing site 112, the center of the mirror 102 bends towards the substrate 104 and the upper surface of the mirror 102 becomes concave. When the pulse is removed, the attraction ceases and the mirror 102 springs upward, becoming convex. Subsequent pulses increase the mirror deformation thereby storing additional energy. By the time the final reset pulse is removed, the energy stored in the mirror 102 is sufficient to spring the mirror 102 away from the landing site 112, allowing the energy stored in the torsion hinge 110 to return the mirror 102 to the neutral position. The electrostatic forces responsible for deforming the mirror 102 and the torsion hinges 110 also torque and flex the spacervias 106, 108, 116 which support portions of the device. The stresses involved can cause the spacervias 106, 108, 116 of prior art DMDs to break, destroying the device. These failures usually occur via two failure modes. The first failure mode occurs when a spacervia 106, 108, 116 breaks at or near the point of attachment of the hinge cap 111, address electrode 114, or mirror 102, that is supported by the top of the spacervia. The second primary failure mode occurs when a spacervia 106, 116, or 108 breaks at or near the point of attachment to the bias/reset bus 200 or hinge yoke 118 beneath the spacervia 106, 108, 116. Failures of the spacervias 106, 108, 116 have been attributed to the poor metal coverage on the spacervia walls, or step coverage, obtained through the present fabrication processes. Usually the metal is too thin either at the base or near the top of the spacervia.

Figure 3A:
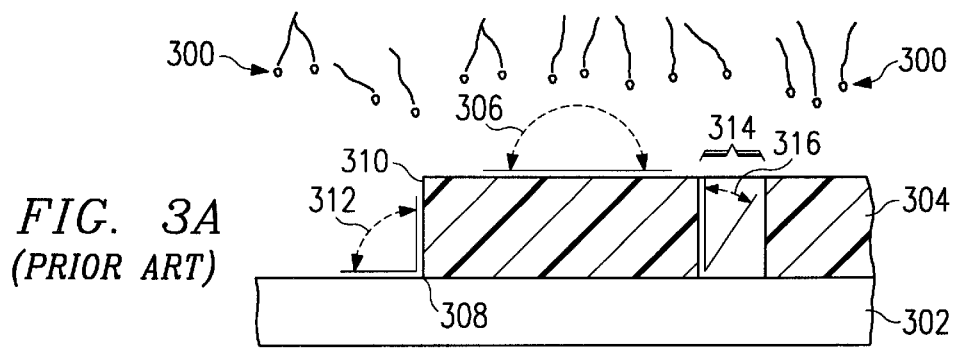
FIG. 3A is a cross-sectional view of metal being sputtered onto a substrate and a layer of sacrificial material.

The address electrode support spacervias 108, the hinge support spacervias 106, and the mirror support spacervias 116 of the prior art are typically made by lining a hole, or via, in a sacrificial material with sputtered metal. When the sacrificial material is removed, the liner remains forming a spacervia. FIG. 3A depicts metal particles 300 being sputtered towards a substrate 302 that is partially covered by sacrificial material 304. During the sputtering process, the metal 300 approaches the surface from all directions. Therefore, metal may reach a flat horizontal surface 320 from a 180° arc, as shown by region 306.

Point 308 at the base of the wall structure 310 is shaded by the wall structure 310 and can only receive metal arriving at point 308 from a 90° arc, as shown by region 312. Because point 308 can only receive metal from half the arc that a planar surface receives metal from, only about half as much metal will be deposited at point 308 compared to a planar area with no shading. The shading problem is even greater for the via 314. Metal must approach the bottom corners of the via 314 almost vertically as shown by region 316. Because more metal can reach the top portion of the walls compared to the bottom portion, an overhang will develop. The overhang further restricts metal from reaching the bottom of the wall, resulting in poor metal coverage of the lower portions of the wall.

Figure 3B:
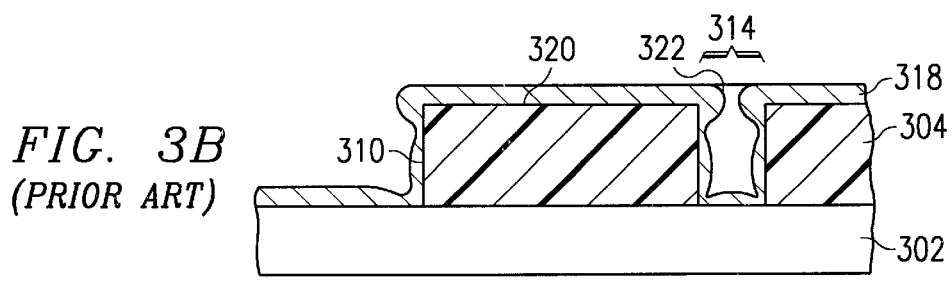
FIG. 3B is a cross-sectional view of the substrate of FIG. 3A after metal has been sputtered onto it.
Figure 3C:
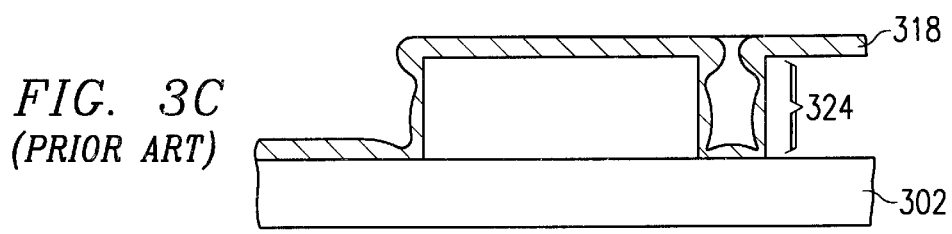
FIG. 3C is a cross-sectional view of the substrate of FIG. 3A after metal has been sputtered onto it and the sacrificial material removed.

FIG. 3B shows a metal layer 318 which has been sputtered onto the substrate 302 and spacer 304 of FIG. 3A. Metal layer 318 is thinner on the sides of a wall structure 310 than on a fat horizontal surface 320. The metal layer 318 is especially thin on the bottom portion of the via 314. A thin area also develops immediately below the top of the via 314. This thin area is caused by overhang 322 which develops at the top of the via 314 as the metal layer 318 is being sputtered. FIG. 3C shows the substrate 302 and metal layer 318 after the sacrificial material 304 has been removed. This leaves a spacervia 324 that was formed in the via 314 through the sacrificial material 304. The thin, weak areas of the metal layer 318 near both the top and bottom of the spacervia 324 are prone to failure when the spacervia 324 is stressed.

The higher the aspect ratio (i.e. ratio of the via height to via width), the worse the step coverage near the bottom of the via is likely to be. When fabricating a spacervia 324, a thick metal layer must be deposited to ensure that adequate metal reaches the lower walls of the via 314. Unfortunately, the metal thickness cannot he arbitrarily increased. As the metal is deposited, the overhang 322 grows faster than the thickness of the metal on the lower portions of the walls and will eventually seal off the via preventing any additional metal from entering the via 314. Other constraints also limit the amount of metal that may be deposited into the via 314 during the typical DMD fabrication steps. For example, during the fabrication of a typical hidden hinge DMD of the prior art, the mirror support spacervia 116 and the mirror 102 are formed during the same metal deposition step. Depositing too much metal will thicken the mirror 102 which reduces the mirror specularity and requires a higher resonant reset frequency. Reset efficiency drops off markedly with increasing reset frequency, because of frequency dependent damping effects. Also, increasing the mirror thickness lengthens the response time of the mirror 102 by increasing the mirror moment of inertia.

There are at least three improvements to spacervias 324 that may increase their strength. First, the size of a spacervia 324 could be enlarged to allow better metal coverage of the sides of the spacervia 324. However, because the mirror support spacervia 116 has an open top which reduces the active area of the DMD mirror 102, enlarging the mirror support spacervia 116 results in an unacceptable loss in mirror active area. Enlarged address support spacervias 108 also reduce the usable size of address electrodes 114, thereby reducing the electrostatic force generated between the address electrode 114 and the mirror 102. A second approach involves changing the profile of the spacervia 324 to avoid reentrant spacervia contours. Reentrant contours occur when the via 314 used to form the spacervia 324 widens after entering the sacrificial material in which the via 314 is formed. A spacervia with a reentrant contour is similar to the overhang discussed above. The overhang causes the reentrant contour spacervia to have poor metal step coverage near the top of the spacervia 324 and may allow the hinge cap 111 or mirror 102 to break away from the spacervia 324. Another solution is to grow an oxide liner on the inside of the spacervia 324 after the metal is deposited. The oxide liner is grown on the inside of the spacervia 324 at the base of the spacervia 324 to give it increased mechanical strength where the metal thickness is insufficient. Although these improvements increase the strength of spacervias 324, they have not yet yielded a sufficiently strong, reliable spacervia 324 for DMDs.

A new architecture and process, called the Reflow Inverse Spacervia Pillar (RISP) process, has been invented to address the mechanical weaknesses of the spacervia design. It replaces the photoresist vias of the prior designs with photoresist pillars. Because the pillars are relatively far apart, the base of the pillars is not shaded to the extent that the base of a via is shaded during the sputtering process. The step coverage of a pillar is much better than the step coverage of a hole or trench having the same aspect ratio. Therefore, a support pillar with a RISP architecture has much better strength than a spacervia 324 of the prior art.

Figure 4A:
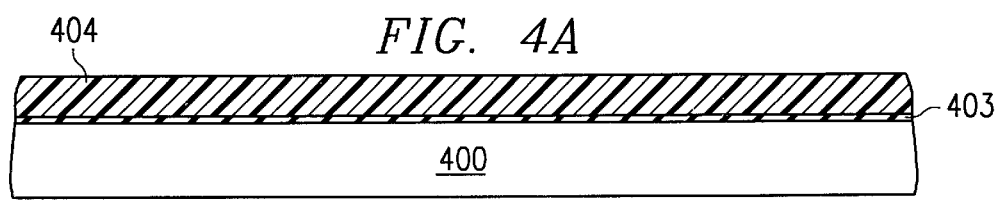
FIG. 4A through 4S are cross-sectional views taken along the hinge axis of one element of a DMD array showing various stages in the fabrication of a DMD element having support posts according to one embodiment of the present invention.
Figure 4B:
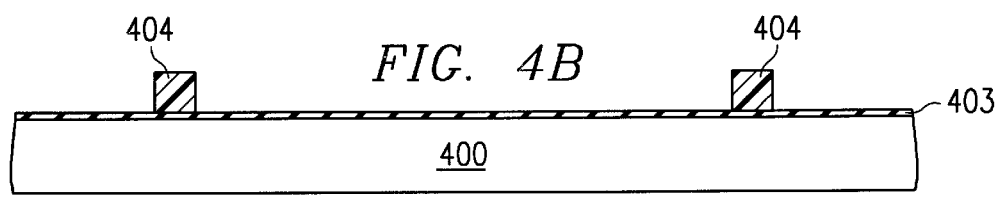
Figure 4C:
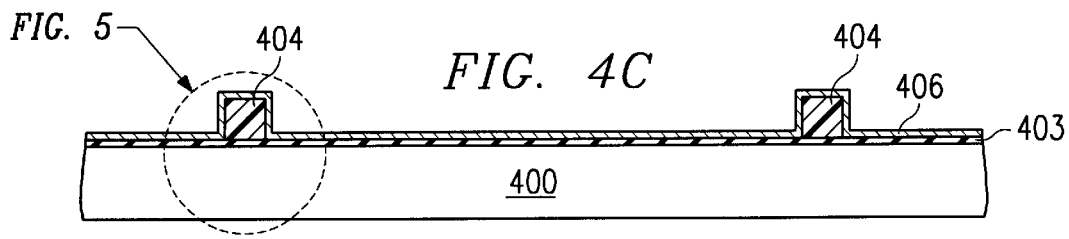
Figure 4I:
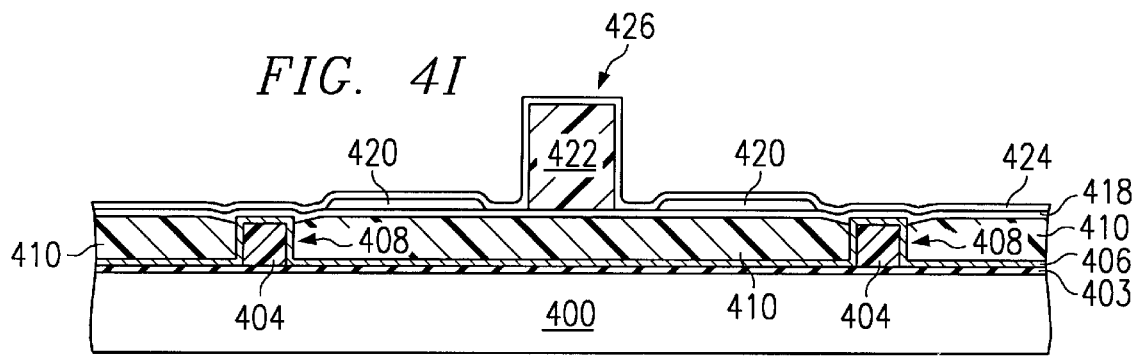
Figure 4J:
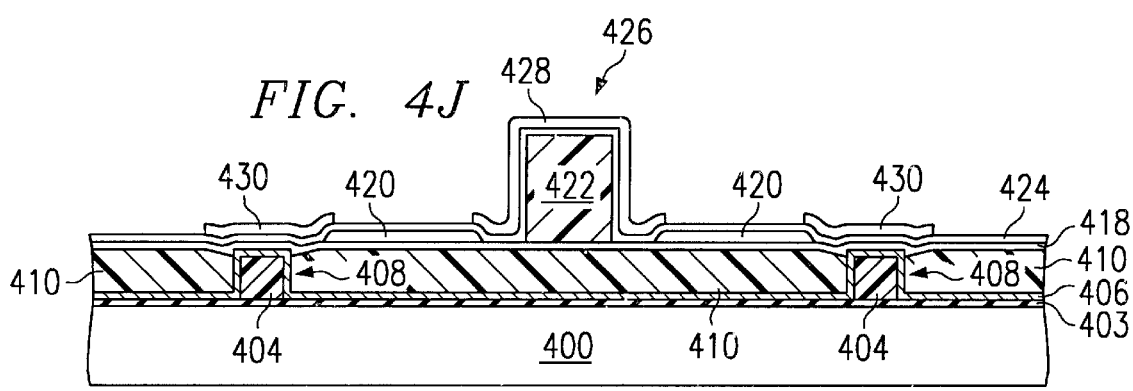
Figure 4K:
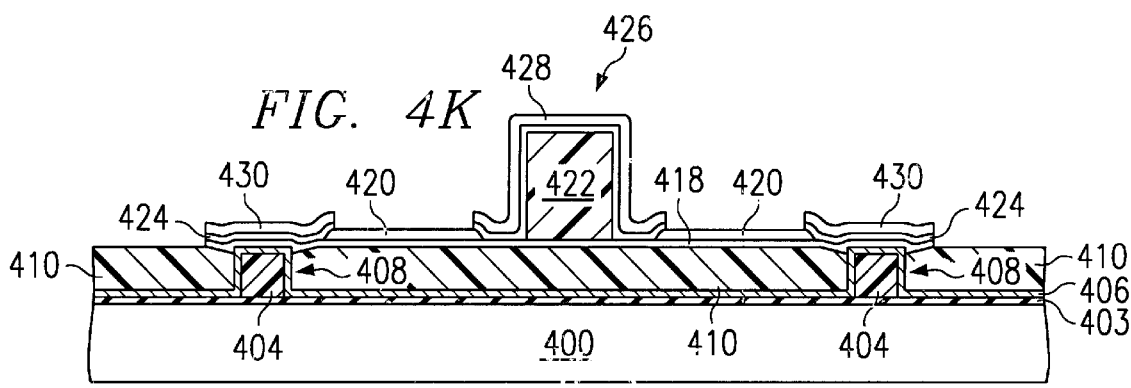
Figure 4L:
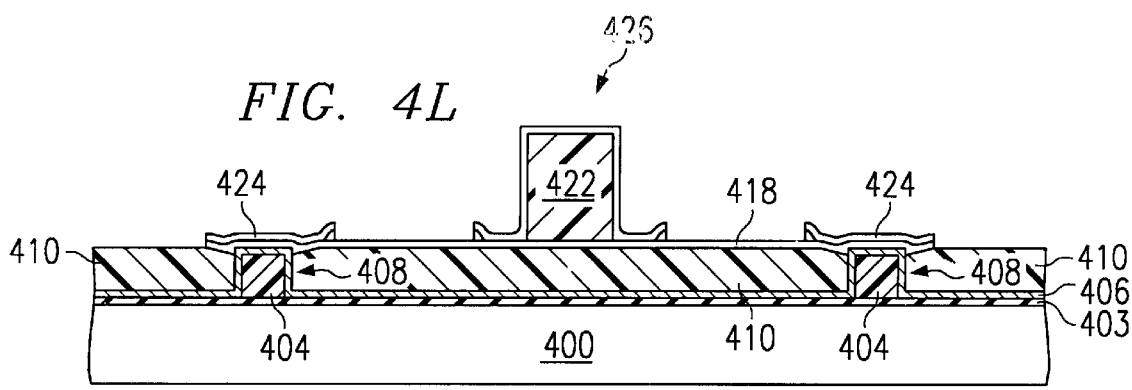
Figure 4M:
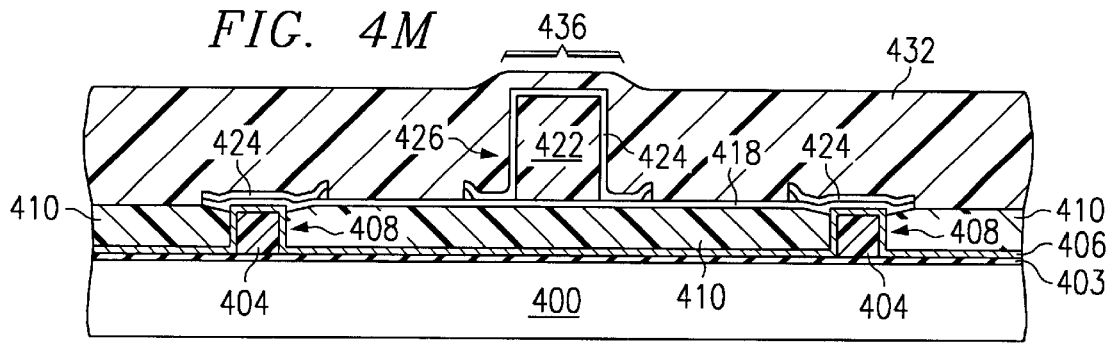
Figure 4N:
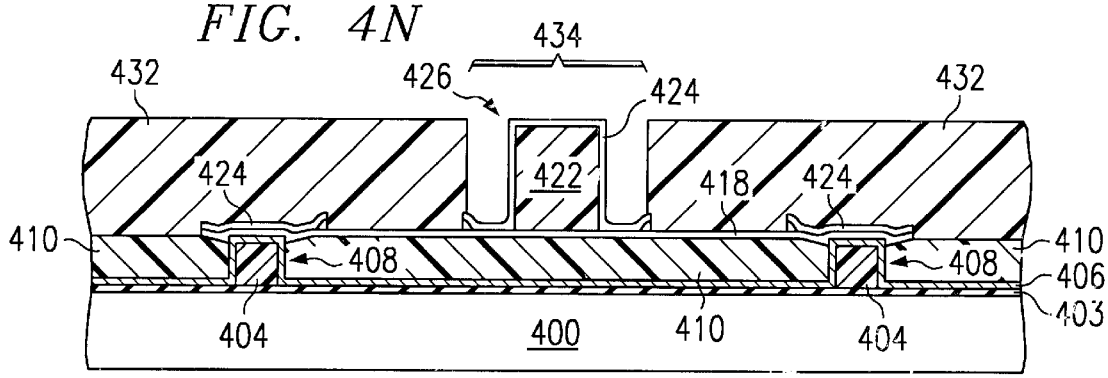
Figure 4O:
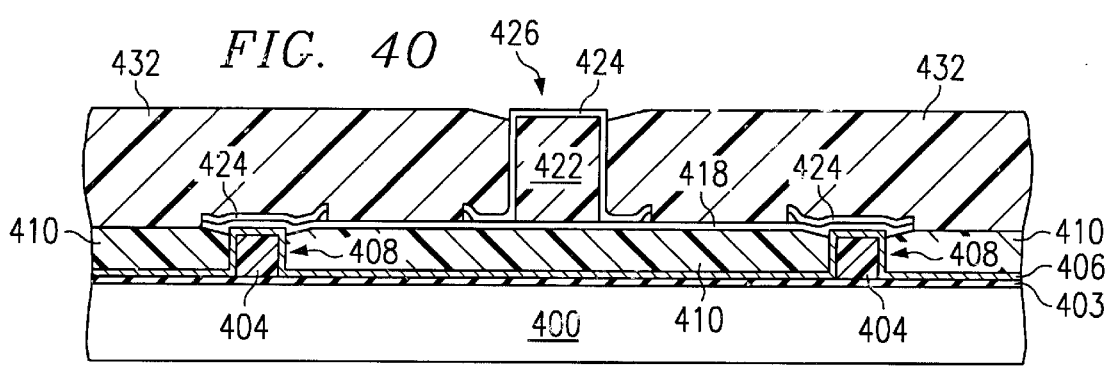
Figure 4P:
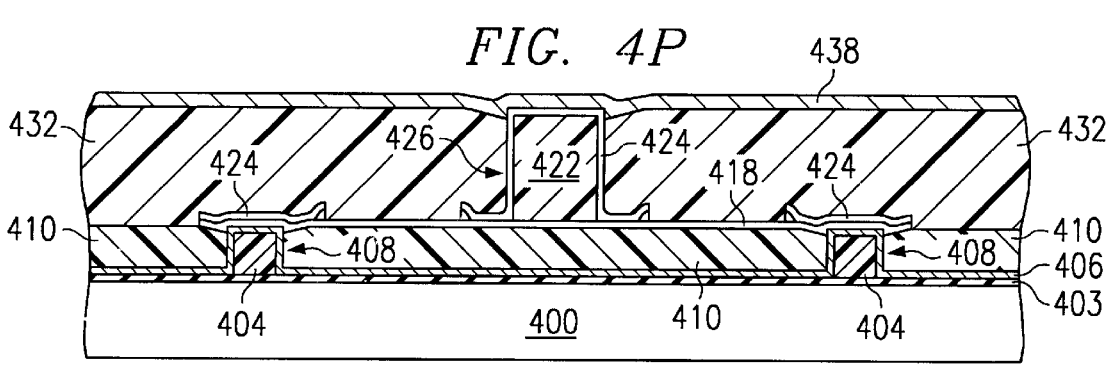
Figure 4Q:
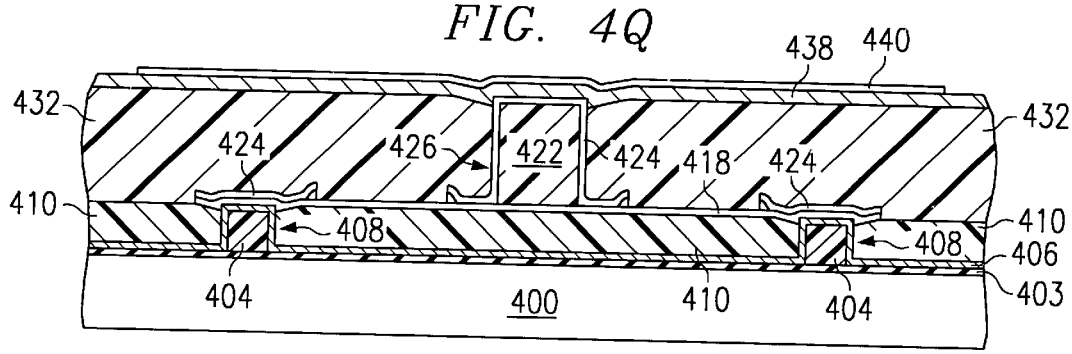
Figure 4R:
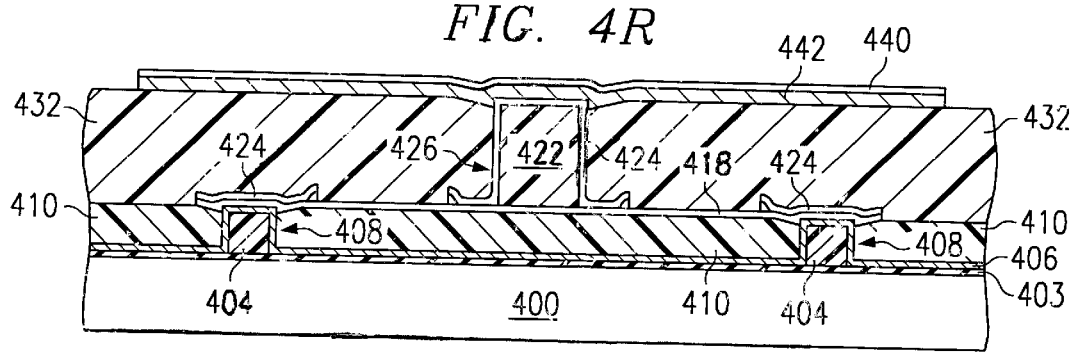
Figure 4S:
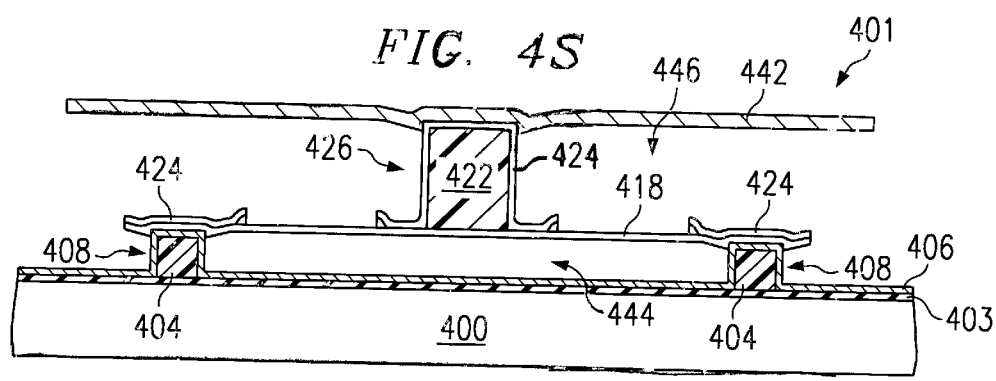

FIGS. 4A through 4S show a cross-sectional view of a DMD element 401, according to one embodiment of the present invention, during the various stages of its fabrication. The cross-sectional views are taken along the hinge axis as shown by 206 in FIG. 2. FIG. 4A shows a substrate wafer 400, typically silicon, on which addressing circuitry and the first two metalization layers previously have been fabricated. The second metal layer is covered with a protective oxide layer 403. Vias 204, shown in FIG. 2, are opened in the oxide layer 403 to allow the metal pads 202 to contact the addressing circuitry fabricated on the substrate 400. Although not shown in FIG. 4A, a thin metal layer is typically deposited over the protective oxide layer 403. This thin metal layer, which is typically tungsten or aluminum, establishes electrical contact with the addressing circuitry on the substrate 400 and may act as an etch stop during subsequent etch steps.

A first layer of pillar material 402, typically a positive organic photoresist layer approximately 1.0 µm thick. is applied to the substrate 400. The layer of pillar material 402 is patterned and developed to leave portions of pillar material 404, as shown in FIG. 4B, which will form an integral part of the hinge support pillars. Portions of the layer of pillar material 402 also will form address electrode support pillars. However, the address electrode support pillars are not shown in the cross section of FIGS. 4A–4S. After the portions of pillar material 404 have been formed, they may he deep UV hardened to a temperature of approximately 220° C. to prevent them from melting or bubbling during the remaining processing steps.

Other materials may be used instead of photoresist for the layer of pillar material 402. Alternate materials are typically dielectrics such as polysilicon, oxide, nitride, or oxynitride. When a dielectric is used, the thin metal layer deposited over the protective oxide layer 403, and into the vias 204, may be used as an etch stop, facilitating complete removal of the pillar material 402 from the vias 204. Although other materials may be used for the pillar material layer 402, photoresist is preferred because most alternate materials require separate patterning and etching steps. For example, a 1 µm thick silicon dioxide layer is grown on the substrate wafer 400 and covered with a layer of photoresist. The photoresist is patterned and developed to protect the portions of the silicon dioxide layer that are to form the support pillars. The silicon dioxide layer is then etched leaving only the desired portions of pillar material 404.

After patterning the layer of pillar material 402, the substrate 400 and the remaining portions of pillar material 404)are covered with a layer of metal 406, as shown in FIG. 4C. The metal layer, typically aluminum or an aluminum alloy, which forms the third metalization layer, M3, is typically sputtered onto the substrate to a thickness of 4000 Angstroms. The M3 metalization layer is patterned to form the bias/reset bus 200 and metal pads 202 that were shown in FIG. 2. Because the sectional views in FIGS. 4A–4S are taken along the hinge axis, the bias/reset bus appears as a continuous layer and the results of patterning the M3 layer are not shown. The completed hinge support pillar 408 is comprised of the remaining portions of pillar material 404 and a sheath to the M3 metal layer 406 which forms the bias/reset bus.

Figure 5:
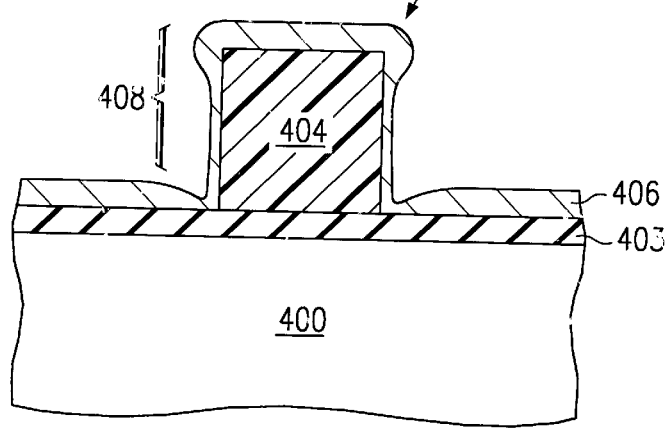
FIG. 5 is a cross-sectional view showing the metal step coverage of the hinge support pillar of FIG. 4C.

FIG. 5 is a cross-sectional view of one portion of a partially fabricated DMD 500 following the deposition of the M3 metal layer 406 showing the step coverage of a metalized hinge support pillar 408 from FIG. 4C. The pillar material 404 is encased in a metal sheath which is thinner on the sides than on the top. As discussed above in regard to FIG. 3, the reduction in metal on the sidewalls compared to metal on the top is due to the partial shading of the pillar material 404. Although the sidewalls receive less metal than the top of the pillar material 404, the remaining portions of pillar material 404 are spaced far enough apart to allow the sidewalls to receive metal from a wider arc, region 312 of FIG. 3A, than the spacervias of the prior art. Therefore, the sidewalls receive more metal, and more uniform coverage than the prior art spacervias. The improved metal coverage, combined with the composite nature of the metalized support pillar 408 results in a much stronger support pillar that does not exhibit a tendency to break away from either the hinge cap or the substrate.

Referring to FIG. 4D, a first spacer layer, called the hinge spacer layer 410, is then spun-on the substrate over the hinge support pillars 408. The hinge spacer layer 410 is typically about 1.0 µm thick and, like all other photoresist layers used in this process, is typically a positive photoresist. As shown in FIG. 4D, the hinge spacer layer 410 will have a bump 412 above each pillar 408. The bumps 412 are caused by the process of spinning on the photoresist and are not desirable. If less photoresist is used to form hinge spacer layer 410, the humps could be avoided but there may be significant undulations in the surface of the photoresist caused by the shadow of the pillar as the photoresist flows around the pillar. The viscosity of the photoresist which is a function at temperature, the spin-rate of the substrate wafer 400, and the thickness of the spacer layer all effect the surface of the finished layer. Under some conditions, it may be advantageous to deposit multiple thin layers rather than one thick layer. The ideal spacer layer would be perfectly planar and extend from the substrate wafer 400 to the top of the pillar 408, leaving a perfectly planar surface on which to continue fabricating the device.

The bumps 412 formed above each pillar 408 may he removed in a two-step process shown in FIGS. 4E and 4F. First, the hinge spacer layer is patterned and developed to form oversized holes 414 through the spacer layer around each pillar 408. This step removes the spacer material that formed the bump 412 on top of each pillar 408. The hinge spacer layer 410 is then exposed to reduce its flow resistance and reflowed, typically by baking on a hot-plate, to fill in the space 416 around each pillar 408. Typically, the surface of the spacer layer 410 is above the tops of the pillars 408 prior to the reflow operation. If the size of the oversized holes 414 has been chosen properly, the material above the pillars 408 flows into the space 416 around each pillar 408 and the reflowed surface height is equal to the pillar height. In addition to filling in the space 416 around the pillars, the reflow process also improves the planarization of the spacer layer 410, and densifies the spacer material.

Planarization of the hinge spacer layer 410 is important in order to ensure consistent hinge strength and integrity. Also, any non-planar features on one device layer will ripple through the fabrication process and affect subsequent layers. Increasing the density of the spacer layer material has the prncess advantage of improving the resistance at the layer to tuture etch steps. After being reflowed. the hinge spacer layer 410 is typically deep UV hardened to a temperature at approximately 200° C. to prevent flow and bubbling during subsequent processing steps.

The hinge layer 418, as shown in FIG. 4G, is typically formed by sputter deposition of a thin aluminum alloy onto hinge spacer layer 410. The hinge layer 418 is typically 600 Angstroms thick and consists of 0.2% Ti, 1% Si and the remainder Al. According to the buried hinge fabrication process, as taught by U.S. Pat. No. 5,061,049, an oxide layer is deposited, typically by plasma deposition, over the hinge layer 418 and patterned in the shape of the torsion hinges to form oxide etch stops 420.

A second level of pillars is built over the hinge metal layer 418 to form the mirror support pillar. The mirror support pillar is fabricated by the same process used to fabricate the hinge and address electrode support pillars. A second layer of pillar material is deposited onto the substrate wafer, and patterned to leave portions of pillar material 422 as shown in FIG. 4H. The second layer of pillar material is typically a 2.2 µm thick layer of photoresist which is deep UV hardened to 180° C. to prevent flow and bubbling during subsequent processing steps. No degradation of the hinge spacer layer 410 or the hinge support pillar material 404 occurs because the first two layers of photoresist were hardened to higher temperatures (200° and 220° C.).

Next, as shown in FIG. 4I, a thick layer of electrode metal 424 is deposited over the first hinge metal layer 418 and the remaining portions of the second layer of pillar material 422.

The electrode metal layer 424 is typically 3750 Angstroms thick is sputter deposited to form the mirror support pillar, hinge cap, and address electrodes. Although not shown in FIG. 4I, the electrode metal layer 424 is much thicker than the hinge metal layer 418. As the electrodes are being deposited. the pillar material 422 is encapsulated by the electrode metal forming the mirror support pillar 426 comprised of the pillar material 422 and a sheath of electrode metal 424. After the electrode metal 424 is deposited, an oxide layer is deposited and patterned as shown in FIG. 4J to form a mirror support pillar etch stop 428, a hinge cap etch stop 430, and an address electrode etch stop (not shown). The mirror support pillar etch stop 428 is patterned to protect both the mirror support pillar and the hinge yoke from the subsequent etch step.

After patterning the etch stops, the electrode metal layer 424 and the hinge metal layer 418 are both etched, leaving only the portions of the metal layers protected by the etch stops as shown in FIG. 4K. The etch stops are then stripped off as shown in FIG. 4L.

A second photoresist spacer layer, called the mirror spacer layer 432 is then spun onto the wafer, see FIG. 4M, and patterned with oversized holes 434 as shown in FIG. 4N to remove photoresist bump 436 and expose the mirror support pillar 426. The spacer is then baked until it is planarized as shown in FIG. 4O. Once again, as the spacer layer 432 reflows, it becomes denser and fills the hole 434 around the mirror support pillar 426 hut does not cover the top of the pillar 426.

A mirror metal layer 438 is deposited onto the second spacer layer 432 and the top of the support pillar 426. Typically the mirror metal layer is sputter deposited 4250 Angstroms thick. Another oxide layer is plasma-deposited and patterned to form a mirror etch stop 440 as shown in FIG. 4Q. The mirror metal layer 438 is then plasma etched to form the mirror 442, as shown in FIG. 4R.

Wafer level processing is now complete. The device must still be undercut by removing the remaining mirror spacer 432 and hinge spacer layers 410 and stripping the mirror oxide etch stop 440 from the mirror 442. Because the mirrors 442 are very fragile after the mirror spacer layer 432 is removed, the devices are typically sawn apart before undercutting the devices. However, this constraint is not a result of the disclosed process but rather a limitation due to existing methods of wafer separation. When wafer separation processes that do not create damaging debris or require damaging cleanup steps become available, the process steps may he reordered to allow the devices to be completed before the wafer is separated.

The mirror etch stop 440 is left in place during wafer separation to protect the mirror surface. The wafers are coated with PMMA, sawn into chip arrays and pulse spin-cleaned with chlorobenzene. After wafer separation, the chips are placed in a plasma etching chamber where mirror etch stop 440 and both spacer layers 432 and 410 are completely removed leaving air gaps 444 and 446 under the hinges and mirrors as shown in FIG. 4S. It is possible to leave portions of the spacer layers 432 and 410 as long as there is a sufficient air gap to allow the hinge to deform and the mirror to deflect.

Because the thermal coefficient of expansion of the encapsulated pillar material nearly matches the thermal coefficient of expansion of the aluminum pillar sheath, the encapsulated material may be left inside the support pillars. If the difference between the thermal coefficient of expansion of the encapsulated material and the thermal coefficient of expansion of the aluminum pillar sheath is too great, the support pillar may break when exposed to high or low temperatures. To prevent damage to the support pillar caused by a mismatch in thermal expansion coefficients, a hole could he patterned in either the electrode or hinge metal layers to allow the encapsulated material to be removed by plasma etching.

Although the RISP process has been taught thus far only in terms of the hidden hinge DMD, many other devices could make use of the process. A conventional torsion beam DMD 600, showvn in FIG. 6, consists of a mirror 604 supported by two torsion hinges 606 over address electrodes 608 fabricated on a semiconductor substrate 610. The RISP process could be used to form the hinge support pillars 602 which support the hinges 606 away from the substrate 610. Other micromechanical devices such as accelerometers, flow sensors, temperature sensors, and motors could also use the RISP process. The disclosed RISP process has several advantages over the conventional processes used to fabricate spacervias. As discussed earlier, the reflow process produces good planarization of the underlying electrode topography and also produces a spacer surface which is denser and less chemically reactive than in the prior art. These characteristics allow the spacer to better resist penetration by the aluminum etch byproducts during the mirror etch process, reducing the etch residues at the surface of the spacer. These etch residues can result in a thin surface film, or web, which may bridge between two mechanical elements, such as the mirrors 102 or hinge yokes 118, preventing the movement of the mirrors 102 and hinge yokes 118. Because there are minimal etch residues, no HF fume cleanup is required.

Thus, although there has been described to this point a particular embodiment for a support pillar and process, it is not intended that such specific references be considered as limitations upon the scope of this invention except insofar as set forth in the following claims. Furthermore, having described the invention in connection with certain specific embodiments thereof it is to he understood that further modifications may now suggest themselves to those skilled in the art, it is intended to cover all such modifications as fall within the scope of the appended claims.

What is claimed is:

1. A micromirror device comprising:
   a substrate;
   at least one hinge support pillar supported by said substrate, said hinge support pillar comprising a first metal sheath fabricated by conformably coating a first pillar-shaped material with metal and removing said first pillar-shaped material;
   at least one hinge connected to said hinge support pillar;
   at least one mirror support pillar connected to said hinge, said mirror support pillar comprising a second metal sheath fabricated by conformably coating a second pillar-shaped material with metal and removing said second pillar-shaped material; and
   at least one mirror element supported by said mirror support pillar.

2. A micromirror device comprising:
   a substrate;
   at least one hinge support pillar supported by said substrate, said hinge support pillar comprising a metal sheath fabricated by conformably coating a pillar-shaped material with metal and removing said pillar-shaped material;
   at least one hinge connected to said hinge support pillar; and at least one mirror element supported by said at least one hinge.

3. The micromirror device of claim 2 wherein said metal sheath is an aluminum alloy.

4. A support pillar for a micromechanical device comprising:
- a substrate;
- a metal sheath supported by said substrate, said metal sheath fabricated by conformably coating a pillar-shaped material and removing said pillar-shaped material.

5. The support pillar of claim 4 wherein said metal sheath is an aluminum alloy.

6. The support pillar of claim 4 further comprising:
- a thin metal layer between said substrate and said metal sheath.

7. The support pillar of claim 6 wherein said thin metal layer is an aluminum alloy.

8. The micromirror device of claim 1 wherein said first metal sheath is an aluminum alloy.

9. The micromirror device of claim 1 wherein said second metal sheath is an aluminum alloy.

10. The micromirror device of claim 1 wherein said at least one hinge is an aluminum alloy.

11. The micromirror device of claim 1 wherein said at least one mirror element is an aluminum alloy.

12. The micromirror device of claim 1 further comprising:
- a thin metal layer between said substrate and said at least one hinge support pillar.

13. The micromirror device of claim 1 wherein each of said at least one mirror support pillars is supported by two of said hinges.

14. The micromirror device of claim 2 wherein said at least one hinge is an aluminum alloy.

15. The micromirror device of claim 2 wherein said at least one mirror element is an aluminum alloy.

16. The micromirror device of claim 2 further comprising:
- a thin metal layer between said substrate and said at least one hinge support pillar.

17. The micromirror device of claim 2 wherein each of said at least one mirror elements is supported by two of said hinges.

* * * * *